(12) United States Patent
Huang

(10) Patent No.: US 11,956,992 B2
(45) Date of Patent: *Apr. 9, 2024

(54) ORGANIC LIGHT-EMITTING DIODE DEVICE INCLUDING METAL SOL, MANUFACTURING METHOD THEREOF, AND DISPLAY DEVICE

(71) Applicant: TCL CHINA STAR OPTOELECTRONICS TECHNOLOGY CO., LTD., Guangdong (CN)

(72) Inventor: Hui Huang, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 685 days.

This patent is subject to a terminal disclaimer.

(21) Appl. No.: 15/734,897

(22) PCT Filed: Aug. 4, 2020

(86) PCT No.: PCT/CN2020/106853
§ 371 (c)(1),
(2) Date: Dec. 3, 2020

(87) PCT Pub. No.: WO2022/000698
PCT Pub. Date: Jan. 6, 2022

(65) Prior Publication Data
US 2022/0006055 A1   Jan. 6, 2022

(30) Foreign Application Priority Data
Jul. 2, 2020 (CN) .......... 202010627445.8

(51) Int. Cl.
*H10K 50/854* (2023.01)
*H10K 71/00* (2023.01)
(Continued)

(52) U.S. Cl.
CPC .......... *H10K 50/854* (2023.02); *H10K 71/00* (2023.02); *H10K 59/12* (2023.02); *H10K 2102/331* (2023.02); *H10K 2102/351* (2023.02)

(58) Field of Classification Search
CPC ...... H10K 50/854; H10K 71/00; H10K 59/12; H10K 2102/331; H10K 2102/351
(Continued)

(56) References Cited

U.S. PATENT DOCUMENTS 11,394,011 B2 * 7/2022 Huang ............... H10K 59/12
2015/0008422 A1   1/2015 Lee et al.
2015/0084005 A1   3/2015 Sista et al.

FOREIGN PATENT DOCUMENTS

CN    1967901 A    5/2007
CN  104303328 A    1/2015
(Continued)

Primary Examiner — Quoc D Hoang

(57) ABSTRACT

An organic light-emitting diode device, a manufacturing method thereof, and a display device are provided. The organic light-emitting diode device includes a light-emitting layer, a functional layer, and a cathode layer, wherein a material of the functional layer includes a metal sol containing metal nanoparticles, and the metal sol forms an uneven nanostructure on a surface of the functional layer, which has a scattering effect on light of the light-emitting layer, thereby reducing a binding force between the light and surface electrons of the cathode layer, so surface plasmon polariton waves can be prevented and light extraction efficiency can be improved.

20 Claims, 4 Drawing Sheets

(51) Int. Cl.
*H10K 59/12* (2023.01)
*H10K 102/00* (2023.01)

(58) Field of Classification Search
USPC .......................................................... 257/40
See application file for complete search history.

(56) References Cited

FOREIGN PATENT DOCUMENTS

| | | |
|---|---|---|
| CN | 105977393 A | 9/2016 |
| CN | 106450016 A | 2/2017 |
| CN | 110943113 A | 3/2020 |
| CN | 111477754 A | 7/2020 |
| KR | 20100068777 A | 6/2010 |

* cited by examiner

ORGANIC LIGHT-EMITTING DIODE DEVICE INCLUDING METAL SOL, MANUFACTURING METHOD THEREOF, AND DISPLAY DEVICE

FIELD OF INVENTION

The present disclosure relates to the field of display technologies, and more particularly, to an organic light-emitting diode device, a manufacturing method thereof, and a display device.

BACKGROUND OF INVENTION

Light loss exists in interiors of current organic light-emitting diode (OLED) devices, which results in most light unable to be effectively emitted to outside of the organic light-emitting diode devices. Meanwhile, most loss is mainly due to a coupling reaction between photons emitted from a light-emitting layer and free electrons of a cathode, which generates surface plasmon polariton waves and makes this part of light unable to reach the outside of the organic light-emitting diode devices, thereby reducing overall luminous efficiency of the organic light-emitting diode devices.

Technical problem: at present, most improvement methods are to increase a distance between a light-emitting layer and a cathode, thereby reducing influences between the two and improving luminous efficiency. However, merely increasing the distance between the light-emitting layer and the cathode will increase defects of film layers inside the organic light-emitting diode devices and change a specific cavity length of the organic light-emitting diode devices, which will cause the film layers inside the organic light-emitting diode devices to be separated and fall off, and reduce light inside the organic light-emitting diode devices, thereby reducing light extraction efficiency of the organic light-emitting diode devices.

In summary, current organic light-emitting diode devices have problems of a coupling reaction between photons emitted from the light-emitting layer and free electrons of the cathode, which generates surface plasmon polariton waves, thereby reducing luminous efficiency of the organic light-emitting diode devices. Therefore, it is necessary to provide an organic light-emitting diode, a manufacturing method thereof, and a display device to improve this defect.

SUMMARY OF INVENTION

An embodiment of the present disclosure provides an organic light-emitting diode, a manufacturing method thereof, and a display device to solve problems of a coupling reaction between photons emitted from a light-emitting layer and free electrons of a cathode existing in current organic light-emitting diode devices, which generates surface plasmon polariton waves, thereby reducing luminous efficiency of the organic light-emitting diode devices.

An embodiment of the present disclosure provides an organic light-emitting diode device which includes an anode layer, a hole transport layer, a light-emitting layer, an electron transport layer, a functional layer, and a cathode layer stacked in sequence.

Wherein, a material of the functional layer includes a metal sol containing metal nanoparticles, and the metal sol forms an uneven nanostructure on one side surface of the functional layer adjacent to the cathode layer.

According to an embodiment of the present disclosure, the metal nanoparticles include one or more of Au nanoparticles, Ag nanoparticles, and Al nanoparticles.

According to an embodiment of the present disclosure, a film layer thickness of the functional layer ranges from 5 nm to 30 nm.

According to an embodiment of the present disclosure, each of the organic light-emitting diode devices further includes a buffer layer formed by an organic material, and the buffer layer is disposed between the functional layer and the electron transport layer.

According to an embodiment of the present disclosure, the organic material includes epoxy resin material.

According to an embodiment of the present disclosure, a film layer thickness of the buffer layer ranges from 10 nm to 50 nm.

According to an embodiment of the present disclosure, each of the organic light-emitting diode devices further includes a hole injection layer and an electron injection layer, the hole injection layer is disposed between the hole transport layer and the anode layer, and the electron injection layer is disposed between the functional layer and the electron transport layer.

An embodiment of the present disclosure provides a display device, which includes a device body and a display panel disposed on the device body. Wherein, the display panel includes a thin film transistor array substrate and a plurality of organic light-emitting diode devices disposed on the thin film transistor array substrate, and each of the organic light-emitting diode devices includes an anode layer, a hole transport layer, a light-emitting layer, an electron transport layer, a functional layer, and a cathode layer stacked in sequence; and a material of the functional layer includes a metal sol containing metal nanoparticles, and the metal sol forms an uneven nanostructure on one side surface of the functional layer adjacent to the cathode layer.

According to an embodiment of the present disclosure, the metal nanoparticles include one or more of Au nanoparticles, Ag nanoparticles, and Al nanoparticles.

According to an embodiment of the present disclosure, a film layer thickness of the functional layer ranges from 5 nm to 30 nm.

According to an embodiment of the present disclosure, each of the organic light-emitting diode devices further includes a buffer layer formed by an organic material, and the buffer layer is disposed between the functional layer and the electron transport layer.

According to an embodiment of the present disclosure, the organic material includes epoxy resin material.

According to an embodiment of the present disclosure, a film layer thickness of the buffer layer ranges from 10 nm to 50 nm.

According to an embodiment of the present disclosure, each of the organic light-emitting diode devices further includes a hole injection layer and an electron injection layer, the hole injection layer is disposed between the hole transport layer and the anode layer, and the electron injection layer is disposed between the functional layer and the electron transport layer.

An embodiment of the present disclosure further provides a manufacturing method of an organic light-emitting diode device, which includes following steps:

providing a substrate and forming an anode layer, a hole transport layer, a light-emitting layer, and an electron transport layer on the substrate in sequence;

coating a layer of metal sol on one side of the electron transport layer away from the light-emitting layer, wherein the metal sol includes metal nanoparticles, and the metal sol is cured to form a functional layer and an uneven nanostructure on one side surface of the functional layer away from the electron transport layer; and manufacturing a cathode layer on one side of the functional layer away from the electron transport layer.

According to an embodiment of the present disclosure, before manufacturing the functional layer, a buffer layer is manufactured on the one side of the electron transport layer away from the light-emitting layer.

According to an embodiment of the present disclosure, a material of the buffer layer includes epoxy resin material.

According to an embodiment of the present disclosure, a film layer thickness of the functional layer ranges from 5 nm to 30 nm.

According to an embodiment of the present disclosure, a film layer thickness of the buffer layer ranges from 10 nm to 50 nm.

According to an embodiment of the present disclosure, the metal nanoparticles include one or more of Au nanoparticles, Ag nanoparticles, and Al nanoparticles.

Beneficial effect: the beneficial effect of the embodiments of the present disclosure is that the embodiments of the present disclosure add a functional layer between a cathode layer and an electron transport layer, wherein, a material of the functional layer includes a metal sol containing metal nanoparticles, which makes the metal sol cured to form the functional layer and an uneven nanostructure on one side surface of the functional layer adjacent to the cathode layer at a same time, and the nanostructure has a scattering effect on light emitted from a light-emitting layer, thereby changing directions of photons and reducing a binding force between the photons and surface electrons on one side of the cathode layer adjacent to the functional layer. Therefore, surface plasmon polariton waves generated by a coupling reaction between the surface electrons of the cathode layer and the photons can be prevented, and light extraction efficiency of organic light-emitting diodes can be improved.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF PREFERRED EMBODIMENTS

Figure 1:
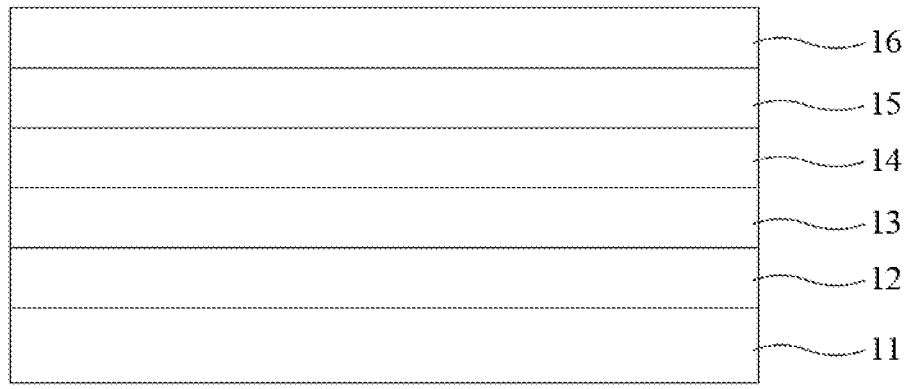
FIG. 1 is a schematic structural diagram of an organic light-emitting diode device according to an embodiment of the present disclosure.

The specific embodiments described with reference to the attached drawings are all exemplary and are intended to illustrate and interpret the present disclosure. In the description of the present disclosure, it should be understood that terms such as "upper", "lower", "front", "rear", "left", "right", "inside", "outside", "side", as well as derivative thereof should be construed to refer to the orientation as described or as shown in the drawings under discussion. Therefore, the directional terms used are to illustrate and understand the present disclosure, not to limit the present disclosure. The identical or similar reference numerals constantly denote the identical or similar elements or elements having the identical or similar functions in the drawings.

The present disclosure will be further explained below in conjunction with the drawings and specific embodiments.

An embodiment of the present disclosure provides an organic light-emitting diode device, which is described in detail below in conjunction with FIG. 1. As shown in FIG. 1, FIG. 1 is a schematic structural diagram of an organic light-emitting diode device 1 according to an embodiment of the present disclosure. The organic light-emitting diode device 1 includes an anode layer 11, a hole transport layer 12, a light-emitting layer 13, an electron transport layer 14, a functional layer 15, and a cathode layer 16 stacked in sequence.

In this embodiment, a material of the functional layer 15 is a metal sol containing metal nanoparticles. When the metal sol is cured to form the functional layer 15, an uneven nanostructure is formed on one side surface of the functional layer 15 adjacent to the cathode layer 16 at a same time. The nanostructure has a scattering effect on light emitted to the cathode layer 16 from the light-emitting layer 13, thereby changing directions of photons and reducing a binding force between the photons and surface electrons on one side of the cathode layer 16 adjacent to the functional layer 15. Therefore, surface plasmon polariton waves generated by a coupling reaction between the surface electrons of the cathode layer 16 and the photons can be prevented, and light extraction efficiency of the organic light-emitting diode device 1 can be improved.

Specifically, in this embodiment of the present disclosure, the metal conductive nanoparticles are Au conductive nanoparticles. Of course, in some embodiments, the metal conductive nanoparticles may also be Ag conductive nanoparticles or Al conductive nanoparticles. In addition, the metal conductive nanoparticles may also be two or more combinations of Au conductive nanoparticles, Ag conductive nanoparticles, and Al conductive nanoparticles, which can also obtain a same technical effect as the embodiments of the present disclosure, and can be selected according to actual needs, which is not limited here.

In the embodiment of the present disclosure, a film layer thickness of the functional layer 15 is 20 nm, and a film layer thickness of the cathode layer 16 can be appropriately thinned to make a sum of the film layer thicknesses of the cathode layer 16 and the functional layer 15 be the same as a film layer thickness of the cathode layer before adding the functional layer 15, thereby ensuring conductivity and electron injection performance inside the organic light-emitting diode device 1 without changing a cavity length of the organic light-emitting diode device 1 and effectively reducing combinations of the photons and surface free electrons of the cathode layer 16 at a same time. Therefore, influences of the surface plasmon polariton waves of the cathode layer 16 can be reduced, and the light extraction efficiency of the organic light-emitting diode device can be improved.

Of course, the film layer thickness of the functional layer 15 is not limited to the film layer thickness provided by the above embodiment. In some embodiments, the film layer thickness of the functional layer 15 may be 5 nm, 10 nm, 25 nm, 30 nm, etc. A specific value of the film layer thickness of the functional layer 15 may be set according to actual needs, and as long as to be set in a range from 5 nm to 30 nm, improved light penetration efficiency of the organic light-emitting diode device 1 can be achieved under a condition that the cavity length remains unchanged.

Figure 2:
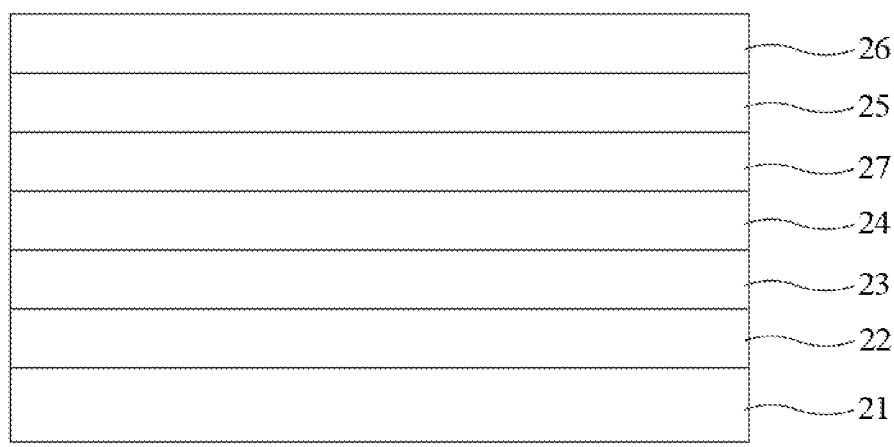
FIG. 2 is a schematic structural diagram of a second organic light-emitting diode device according to an embodiment of the present disclosure.

An embodiment of the present disclosure further provides an organic light-emitting diode device, as shown in FIG. 2. FIG. 2 is a schematic structural diagram of an organic light-emitting diode device 2 according to an embodiment of the present disclosure, and a structure thereof is roughly the same as a structure of the organic light-emitting diode device 1 provided in the above embodiment. The organic light-emitting diode device 2 includes an anode layer 21, a hole transport layer 22, a light-emitting layer 23, an electron transport layer 24, a functional layer 25, and a cathode layer 26 stacked in sequence. A difference is that the organic light-emitting diode device 2 provided in this embodiment further includes a buffer layer 27 manufactured by an organic material, and the buffer layer 27 is disposed between the functional layer 25 and the electron transport layer 24.

Specifically, in this embodiment, a material of the buffer layer 27 is the organic material. The buffer layer 27 made of the organic material is disposed between the electron transport layer 24 and the functional layer 25 to protect film layers such as the electron transport layer 24 and the light-emitting layer 23, thereby preventing the film layers such as the electron transport layer 24 and the light-emitting layer 23 from being damaged during processes of forming the functional layer 25 and the cathode layer 26.

Preferably, the organic material is epoxy resin. Excellent adhesion, mechanical properties, and stability of epoxy resin material can be used to protect the film layers such as the electron transport layer 24 and the light-emitting layer 23, while preventing the functional layer 25 and the electron transport layer 24 from being separated and falling off. In some embodiments, the organic material may also be other materials having properties same as or similar to epoxy resin, which is not limited here.

Specifically, in this embodiment, a film layer thickness of the buffer layer 27 is 10 nm, a film layer thickness of the functional layer 25 is 10 nm, and a film layer thickness of the cathode layer 26 can be appropriately thinned compared to original film layer thickness, so that a total film layer thickness of the buffer layer 27, the functional layer 25, and the cathode layer 26 can be the same as a film layer thickness of original cathode layer, thereby ensuring a cavity length of the organic light-emitting diode device 2 to remain unchanged. Therefore, light emitted by the light-emitting layer 23 can be superimposed in the organic light-emitting diode device 2 through characteristics of light, and light intensity can be enhanced.

Of course, the film layer thicknesses of the buffer layer 27, the functional layer 25, and the cathode layer 26 are not limited to the film layer thicknesses provided in the above embodiments. In some embodiments, as long as the film layer thickness of the buffer layer 27 ranges from 10 nm to 50 nm, the film layer thickness of the functional layer 25 ranges from 5 nm to 30 nm, and the film layer thickness of the cathode layer 26 ranges from 20 nm to 100 nm, improved light penetration efficiency of the organic light-emitting diode device 2 can be achieved under a condition that the cavity length remains unchanged.

Alternatively, in this embodiment, a material of the cathode layer 26 may be a metal or a metal oxide. Preferably, the material of the cathode layer 26 is a metal oxide, such as ZnO or IZO. Of course, in some embodiments, the material of the cathode layer 26 may also be metal materials or a stacked structure formed by the metal materials, which is not limited here.

Figure 3:
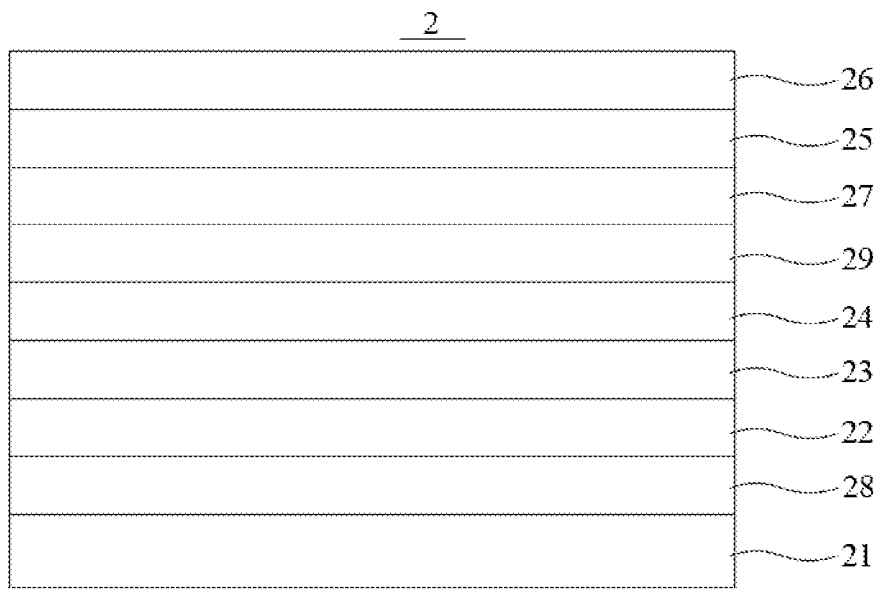
FIG. 3 is a schematic structural diagram of a third organic light-emitting diode device according to an embodiment of the present disclosure.

In some embodiments, as shown in FIG. 3, FIG. 3 is a schematic structural diagram of another organic light-emitting diode device according to an embodiment of the present disclosure. The organic light-emitting diode device may also include a hole injection layer 28 and an electron injection layer 29, wherein, the hole injection layer 28 is disposed between the hole transport layer 22 and the anode layer 21, and the electron injection layer 29 is disposed between the functional layer 25 and the electron transport layer 24. Specifically, the electron injection layer 29 is disposed between the buffer layer 27 and the electron transport layer 24. Of course, in another embodiments, the organic light-emitting diode device 2 may also include other film layers having auxiliary functions other than the hole injection layer 27 and the electron injection layer 28, which can be disposed according to actual needs and is not limited here.

The beneficial effect of the embodiments of the present disclosure is that the embodiments of the present disclosure add the functional layer between the cathode layer and the electron transport layer, wherein, the material of the functional layer includes the metal sol containing the metal nanoparticles, which makes the metal sol cured to form the functional layer and the uneven nanostructure on one side surface of the functional layer adjacent to the cathode layer at a same time, and the nanostructure has a scattering effect on light emitted from the light-emitting layer, thereby changing directions of photons and reducing a binding force between the photons and surface electrons on one side of the cathode layer adjacent to the functional layer. Therefore, the surface plasmon polariton waves generated by a coupling reaction between the surface electrons of the cathode layer and the photons can be prevented, and light extraction efficiency of the organic light-emitting diode can be improved.

Figure 4:
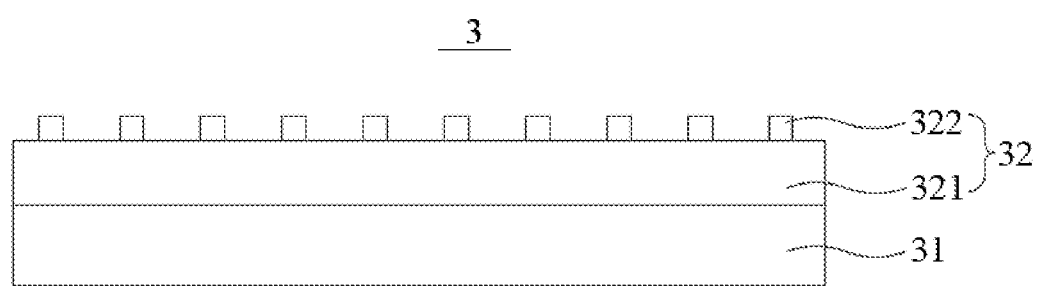
FIG. 4 is a schematic structural diagram of a display device according to an embodiment of the present disclosure.

An embodiment of the present disclosure further provides a display device, which is described in detail below in conjunction with FIG. 4. FIG. 4 is a schematic structural diagram of a display device 3 according to an embodiment of the present disclosure. The display device 3 includes a device body 31 and a display panel 32 disposed on the device body 31. The display panel 32 includes a thin film transistor array substrate 321 and a plurality of organic light-emitting diode devices 322 disposed on the thin film transistor array substrate 321, and each of the organic light-emitting diode devices 322 is the organic light-emitting diode device provided in the above embodiments. The display device 3 provided in the embodiment of the present disclosure can also achieve a same technical effect as the organic light-emitting diode devices provided in the above embodiments, and is not repeated here.

Figure 5:
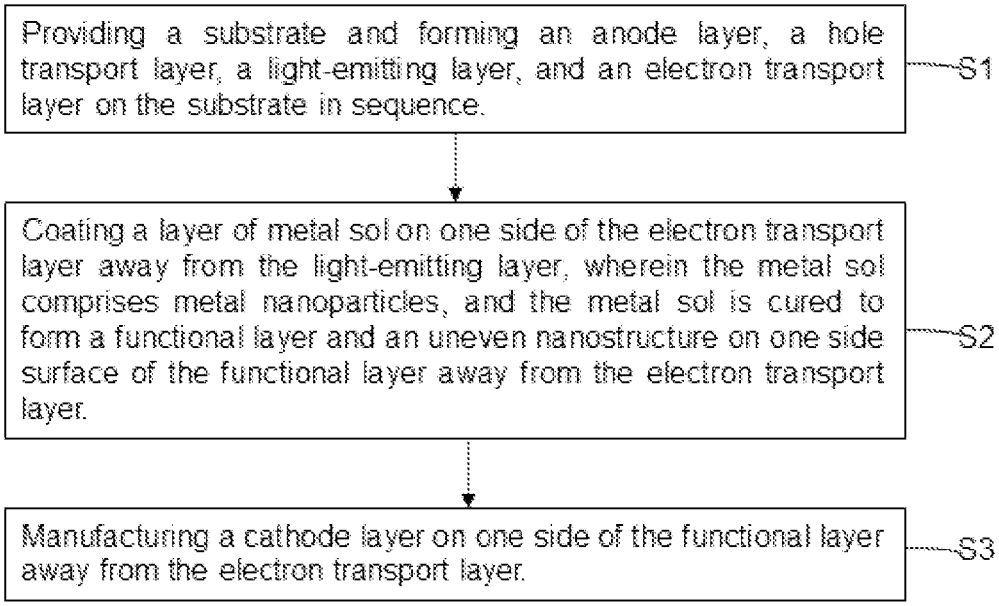
FIG. 5 is a flowchart of a manufacturing method of an organic light-emitting diode device according to an embodiment of the present disclosure.
Figure 6A:
FIGS. 6A to 6C are schematic structural diagrams of organic light-emitting diode devices corresponding to the manufacturing method in FIG. 5.
Figure 6B:
Figure 6C:

An embodiment of the present disclosure further provides a manufacturing method of an organic light-emitting diode device, which is described in detail in conjunction with FIGS. 5, and 6A to 6C. FIG. 5 is a flowchart of the manufacturing method of the organic light-emitting diode device according to this embodiment, and FIGS. 6A to 6C are schematic structural diagrams of the organic light-emitting diode devices corresponding to the manufacturing method provided in this embodiment.

The manufacturing method of the organic light-emitting diode device provided in this embodiment includes following steps.

Step S1: as shown in FIG. 6A, providing a substrate 40 and forming an anode layer 41, a hole transport layer 42, a light-emitting layer 43, and an electron transport layer 44 on the substrate 40 in sequence;

step S2: as shown in FIG. 6B, coating a layer of metal sol on one side of the electron transport layer 44 away from the light-emitting layer 43, wherein the metal sol includes metal nanoparticles, and the metal sol is cured to form a functional layer 45 and an uneven nanostructure on one side surface of the functional layer 45 away from the electron transport layer 44; and step S3: as shown in FIG. 6C, manufacturing a cathode layer 46 on one side of the functional layer 45 away from the electron transport layer 44.

In this embodiment, processes in the step S1 of forming the anode layer 41, the hole transport layer 42, the light-emitting layer 43, and the electron transport layer 44 may adopt processes of manufacturing the above-mentioned film layers in current technology, which is not limited here.

In the step S2, the method of forming the layer of metal sol on the one side of the electron transport layer 44 away from the light-emitting layer 43 includes coating, spin-coating, or inkjet printing. Preferably, in the step S2, the metal sol is directly coated on a surface of the electron transport layer 44 by inkjet printing.

Further, in the step S2, the metal nanoparticles are Au nanoparticles, and the nanostructure formed by curing the metal sol has a scattering effect on light emitted to the cathode layer 46 from the light-emitting layer 43, thereby changing directions of photons and reducing a binding force between the photons and surface electrons on one side surface of the cathode layer 46 adjacent to the functional layer 45. Therefore, surface plasmon polariton waves generated by a coupling reaction between the surface electrons of the cathode layer 46 and the photons can be prevented, and light extraction efficiency of organic light-emitting diodes can be improved.

Of course, in some embodiments, the metal nanoparticles may also be Ag nanoparticles or Al nanoparticles. In addition, the metal nanoparticles may also be two or more combinations of Au nanoparticles, Ag nanoparticles, and Al nanoparticles, which can also obtain the same technical effect as the embodiments of the present disclosure, and can be selected according to actual needs, which is not limited here.

In this embodiment, in the step S2, before manufacturing the functional layer 45, a buffer layer (not shown in the figure) is manufactured on the one side of the electron transport layer 44 away from the light-emitting layer 43.

In this embodiment, a material of the buffer layer is an organic material. The buffer layer made of the organic material is disposed between the electron transport layer 44 and the functional layer 45 to protect film layers such as the electron transport layer 44 and the light-emitting layer 43, thereby preventing the film layers such as the electron transport layer 44 and the light-emitting layer 43 from being damaged during processes of forming the functional layer 45 and the cathode layer 46.

Preferably, the organic material is epoxy resin. Excellent adhesion, mechanical properties, and stability of epoxy resin material can be used to protect the film layers such as the electron transport layer 44 and the light-emitting layer 43, while preventing the functional layer 45 and the electron transport layer 44 from being separated and falling off. In some embodiments, the organic material may also be other materials having properties same as or similar to epoxy resin, which is not limited here.

Specifically, in this embodiment, a film layer thickness of the buffer layer is 10 nm, a film layer thickness of the functional layer 45 is 10 nm, and a film layer thickness of the cathode layer 46 can be appropriately thinned compared to original film layer thickness, so that a total film layer thickness of the buffer layer, the functional layer 45, and the cathode layer 46 can be the same as a film layer thickness of original cathode layer, thereby ensuring a cavity length of the organic light-emitting diode device to remain unchanged. Therefore, light emitted by the light-emitting layer 43 can be superimposed in the organic light-emitting diode device through characteristics of light, and light intensity can be enhanced.

Of course, the film layer thicknesses of the buffer layer, the functional layer 45, and the cathode layer 46 are not limited to the film layer thicknesses provided in the above embodiments. In some embodiments, as long as the film layer thickness of the buffer layer ranges from 10 nm to 50 nm, the film layer thickness of the functional layer 45 ranges from 5 nm to 30 nm, and the film layer thickness of the cathode layer 46 ranges from 20 nm to 100 nm, improved light penetration efficiency of the organic light-emitting diode device can be achieved under a condition that the cavity length remains unchanged.

The beneficial effect of the embodiment of the present disclosure is that the manufacturing method provided by the embodiment of the present disclosure adds the functional layer between the cathode layer and the light-emitting layer, wherein, the material of the functional layer includes an acidic metal sol containing the metal nanoparticles, which makes the metal sol cured to form the functional layer and the uneven nanostructure on one side surface of the functional layer adjacent to the cathode layer at a same time, and the nanostructure has the scattering effect on light emitted from the light-emitting layer, thereby changing directions of photons and reducing a binding force between the photons and surface electrons on one side of the cathode layer adjacent to the functional layer. Therefore, the surface plasmon polariton waves generated by the coupling reaction between the surface electrons of the cathode layer and the photons can be prevented, and the light extraction efficiency of the organic light-emitting diodes can be improved.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. An organic light-emitting diode device, comprising an anode layer, a hole transport layer, a light-emitting layer, an electron transport layer, a functional layer, and a cathode layer stacked in sequence;

wherein a material of the functional layer comprises a metal sol comprising metal nanoparticles, and the metal sol forms an uneven nanostructure on one side surface of the functional layer adjacent to the cathode layer.

2. The organic light-emitting diode device according to claim 1, wherein the metal nanoparticles comprise one or more of Au nanoparticles, Ag nanoparticles, and Al nanoparticles.

3. The organic light-emitting diode device according to claim 1, wherein a film layer thickness of the functional layer ranges from 5 nm to 30 nm.

4. The organic light-emitting diode device according to claim 1, comprising a buffer layer formed by an organic material, wherein the buffer layer is disposed between the functional layer and the electron transport layer.

5. The organic light-emitting diode device according to claim 4, wherein the organic material comprises epoxy resin material.

6. The organic light-emitting diode device according to claim 4, wherein a film layer thickness of the buffer layer ranges from 10 nm to 50 nm.

7. The organic light-emitting diode device according to claim 1, comprising a hole injection layer and an electron injection layer, wherein the hole injection layer is disposed between the hole transport layer and the anode layer, and the electron injection layer is disposed between the functional layer and the electron transport layer.

8. A display device, comprising a device body and a display panel disposed on the device body, wherein the display panel comprises a thin film transistor array substrate and a plurality of organic light-emitting diode devices disposed on the thin film transistor array substrate, and each of the organic light-emitting diode devices comprises an anode layer, a hole transport layer, a light-emitting layer, an electron transport layer, a functional layer, and a cathode layer stacked in sequence; and
wherein a material of the functional layer comprises a metal sol comprising metal nanoparticles, and the metal sol forms an uneven nanostructure on one side surface of the functional layer adjacent to the cathode layer.

9. The display device according to claim 8, wherein the metal nanoparticles comprise one or more of Au nanoparticles, Ag nanoparticles, and Al nanoparticles.

10. The display device according to claim 8, wherein a film layer thickness of the functional layer ranges from 5 nm to 30 nm.

11. The display device according to claim 8, wherein each of the organic light-emitting diode devices further comprises a buffer layer formed by an organic material, and the buffer layer is disposed between the functional layer and the electron transport layer.

12. The display device according to claim 11, wherein the organic material comprises epoxy resin material.

13. The display device according to claim 11, wherein a film layer thickness of the buffer layer ranges from 10 nm to 50 nm.

14. The display device according to claim 8, wherein each of the organic light-emitting diode devices further comprises a hole injection layer and an electron injection layer, the hole injection layer is disposed between the hole transport layer and the anode layer, and the electron injection layer is disposed between the functional layer and the electron transport layer.

15. A manufacturing method of an organic light-emitting diode device, comprising following steps:
providing a substrate and forming an anode layer, a hole transport layer, a light-emitting layer, and an electron transport layer on the substrate in sequence;
coating a layer of metal sol on one side of the electron transport layer away from the light-emitting layer, wherein the metal sol comprises metal nanoparticles, and the metal sol is cured to form a functional layer and an uneven nanostructure on one side surface of the functional layer away from the electron transport layer; and
manufacturing a cathode layer on one side of the functional layer away from the electron transport layer.

16. The manufacturing method of the organic light-emitting diode device according to claim 15, wherein before manufacturing the functional layer, a buffer layer is manufactured on the one side of the electron transport layer away from the light-emitting layer.

17. The manufacturing method of the organic light-emitting diode device according to claim 16, wherein a material of the buffer layer comprises epoxy resin material.

18. The manufacturing method of the organic light-emitting diode device according to claim 16, wherein a film layer thickness of the functional layer ranges from 5 nm to 30 nm.

19. The manufacturing method of the organic light-emitting diode device according to claim 16, wherein a film layer thickness of the buffer layer ranges from 10 nm to 50 nm.

20. The manufacturing method of the organic light-emitting diode device according to claim 15, wherein the metal nanoparticles comprise one or more of Au nanoparticles, Ag nanoparticles, and Al nanoparticles.

* * * * *